(12) United States Patent
Abe

(10) Patent No.: US 8,551,797 B2
(45) Date of Patent: Oct. 8, 2013

(54) METHOD FOR FABRICATING SEMICONDUCTOR LASER

(75) Inventor: Shinji Abe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/597,305

(22) Filed: Aug. 29, 2012

(65) Prior Publication Data

US 2013/0217157 A1  Aug. 22, 2013

(51) Int. Cl.
*H01L 21/00* (2006.01)

(52) U.S. Cl.
USPC .............................................. 438/45; 438/47

(58) Field of Classification Search
USPC ..................................... 438/45–47
See application file for complete search history.

(56) References Cited

U.S. PATENT DOCUMENTS

| 5,376,582 A | 12/1994 | Behfar-Rad et al. | |
|---|---|---|---|
| 6,775,310 B2 * | 8/2004 | Sai et al. | 372/45.01 |
| 7,682,857 B2 * | 3/2010 | Hanamaki et al. | 438/30 |
| 2012/0114000 A1 | 5/2012 | Taniguchi | |
| 2012/0195338 A1 * | 8/2012 | Nishioka et al. | 372/45.01 |

FOREIGN PATENT DOCUMENTS

| JP | 61-32545 A | 2/1986 |
|---|---|---|
| JP | 7-122816 A | 5/1995 |
| JP | 2007-242718 A | 9/2007 |
| JP | 2011-14832 A | 1/2011 |

\* cited by examiner

*Primary Examiner* — Richard Booth
(74) *Attorney, Agent, or Firm* — Leydig, Voit & Mayer, Ltd.

(57) ABSTRACT

A method for fabricating a semiconductor laser includes: sequentially forming a cladding layer of a first conductivity type, an active layer, a cladding layer of a second conductivity type, and a contact layer of the second conductivity type on a semiconductor substrate; forming a promotion film which contacts the contact layer only in a window region proximate an end plane of the semiconductor laser and absorbs group-III atoms from the contact layer to promote generation of group-III vacancies; implanting ions into the contact layer in the window region to damage the contact layer in the window region; and after forming the promotion film and implanting the ions, heat treating so that the group-III vacancies are diffused and the active layer is disordered in the window region and forms a window structure.

6 Claims, 5 Drawing Sheets

WINDOW REGION    NON-WINDOW REGION    WINDOW REGION

WINDOW REGION    NON-WINDOW REGION    WINDOW REGION

WINDOW REGION  NON-WINDOW REGION  WINDOW REGION

WINDOW REGION   NON-WINDOW REGION   WINDOW REGION

WINDOW REGION   NON-WINDOW REGION   WINDOW REGION

METHOD FOR FABRICATING SEMICONDUCTOR LASER

BACKGROUND OF THE INVENTION

1. Field of the Invention

The present invention relates to a method for fabricating a semiconductor laser that can stably form a window structure to elevate the output of a semiconductor laser.

2. Background Art

The light output end plane of the GaAs, AlGaAs group semiconductor laser has a number of surface levels, through which non-luminescence recombination occurs. As a result, an active layer becomes a light absorbing region in the vicinity of the light output end plane. If the optical output density elevates, local heating occurs in the light absorbing region, the band gap is shortened, and positive feedback which increases light absorption causes deterioration called COD (Catastrophic Optical Damage).

The COD is a cause to inhibit the output elevation of the semiconductor laser. To prevent the COD, it is proposed to form a window structure having a larger band gap than the band gap of the active layer in the vicinity of the end plane. However, since local heating increases when the output of the semiconductor laser is elevated and decrease in band gap is raised, it is required for output elevating to increase the band gap difference between the non-window region and the window region.

As the method for forming the window of the GaAs, AlGaAs group semiconductor laser, an IFVD (Impurity Free Vacancy Disordering) has been known (for example, refer to Patent Document 1: Japanese Patent Application Laid-Open No. 7-122816). Specifically, a dielectric film to inhibit the generation of Ga holes is formed on a non-window region, a dielectric film to promote the generation of Ga holes is formed on a window region, and a heat treatment is performed at, for example, 900° C. Due to this, Ga holes are diffused in the window region, and active layers are disordered via Ga holes to form a window structure. For example, a method to control the generation and inhibition using the difference in the refractive indices of $SiN_x$ films is proposed (for example, refer to Patent Document 2: Japanese Patent No. 4748545).

SUMMARY OF THE INVENTION

In conventional IFVD methods, heat treatment at a high temperature is required. For elevating the output of a semiconductor laser, the band gap difference between the window portion and the non-window portion must be increased. However, for increasing the band gap variation of the window region in the IFVD methods the heat treatment temperature must be further elevated. In the case of the GaAs, AlGaAs group semiconductor laser, however, heat treatment at temperatures higher than 900° C. induces the drop of As, the surface of the semiconductor becomes rough, and the contact resistance with the electrode is increased. Also, the dielectric films are cracked to create variations in the diffusion of Ga holes in the window region.

In view of the above-described problems, an object of the present invention is to provide a method for fabricating a semiconductor laser that can stably form a window structure to elevate the output of a semiconductor laser.

According to the present invention, a method for fabricating a semiconductor laser includes: sequentially forming a cladding layer of a first conductivity type, an active layer, a cladding layer of a second conductivity type, and a contact layer of the second conductivity type on a semiconductor substrate; forming a promotion film which contacts to the contact layer only in a window region in the vicinity of an end plane and absorbs group-III atoms from the contact layer to promote a generation of group-III holes; implanting ions into the contact layer in the window region to damage the contact layer in the window region; and after forming the promotion film and implanting the ions, performing a heat treatment so that the group-III holes are diffused and the active layer is disordered in the window region to form a window structure.

The present invention makes it possible to stably form a window structure to elevate the output of a semiconductor laser.

Other and further objects, features and advantages of the invention will appear more fully from the following description.

DETAILED DESCRIPTION OF THE PREFERRED EMBODIMENTS

A method for fabricating a semiconductor laser according to the embodiments of the present invention will be described with reference to the drawings. The same components will be denoted by the same symbols, and the repeated description thereof may be omitted.

First Embodiment

FIGS. 1 to 5 are sectional views showing the method for fabricating a semiconductor laser according to the first embodiment of the present invention. These drawings are sectional views taken along the direction of the laser oscillations.

Figure 1:
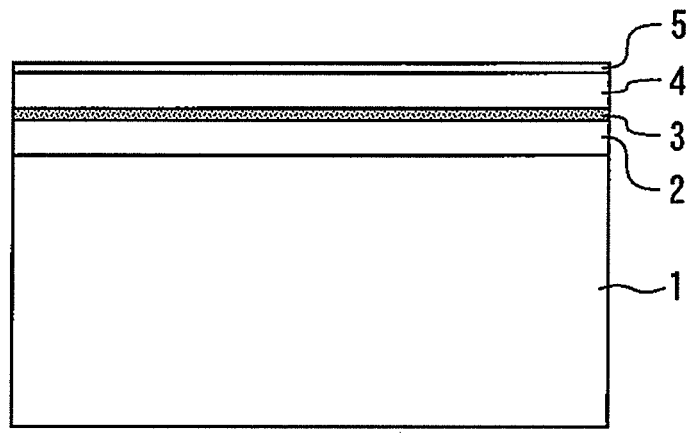
FIGS. 1 to 5 are sectional views showing the method for fabricating a semiconductor laser according to the first embodiment of the present invention.

Firstly, as shown in FIG. 1, on a Si-doped n-type GaAs substrate, an n-type clad layer 2 composed of $Al_{0.48}Ga_{0.52}As$ having a thickness of 2.8 μm, an active layer 3 of a quantum well structure composed of $Al_{0.335}Ga_{0.665}As$ (10 nm)/$Al_{0.112}Ga_{0.885}As$ (8.4 nm)/$Al_{0.335}Ga_{0.665}As$ (8.4 nm)/$Al_{0.112}Ga_{0.885}As$ (8.4 nm)/$Al_{0.335}Ga_{0.665}As$ (10 nm), a p-type clad layer 4 composed of $Al_{0.48}Ga_{0.52}As$ composed of a thickness of 0.165 μm, and a p-type contact layer 5 composed of GaAs having a thickness of 20 nm are formed by MOCVD (Metal Organic Chemical Vapor Deposition) sequentially from the above.

Figure 2:
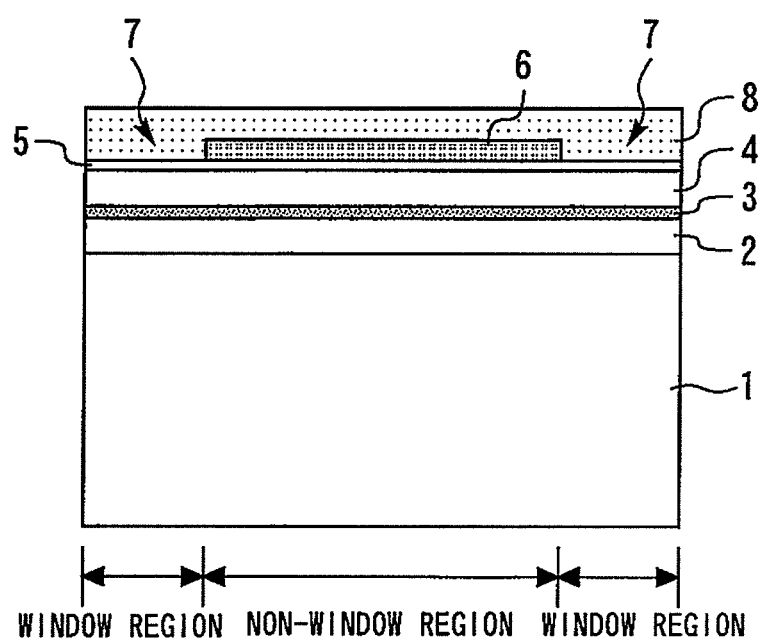

Next, as shown in FIG. 2, an inhibition film 6 having a thickness of 400 Å composed of SiN is formed on the p-type contact layer 5 using thermal CVD (Chemical Vapor Deposition). Thereafter, a resist is applied onto the inhibition film 6, and the resist is patterned using a photoengraving process and etched to form an opening 7 in the inhibition film 6 at the window region in the vicinity of the end plane.

Next, a promotion film 8 composed of $SiO_2$ having a thickness of 2000 Å is formed on the inhibition film 6 and on the p-type contact layer 5 in the opening 7 using spattering. Here, the inhibition film 6 inhibits the formation of Ga holes, and the promotion film 8 absorbs Ga atoms from the p-type contact layer 5 to promote the generation of Ga holes. The promotion film 8 contacts to the p-type contact layer 5 only in the window region.

Figure 3:
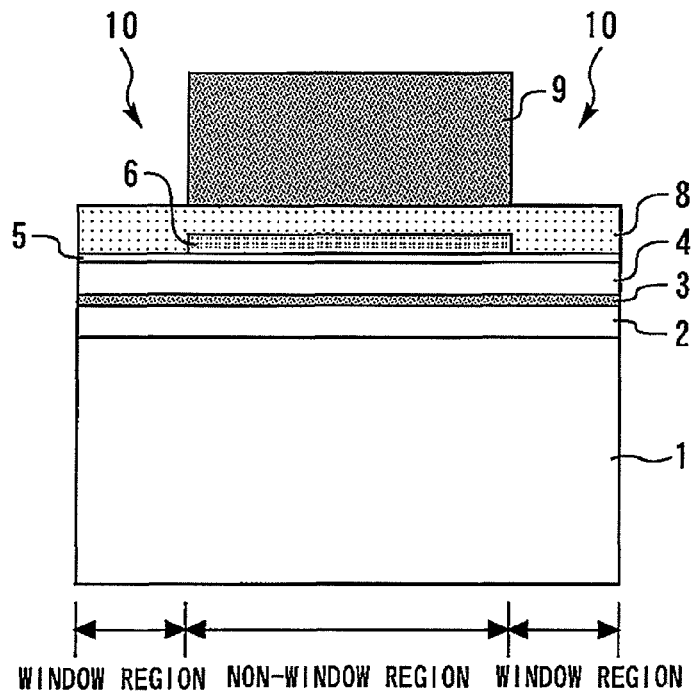

Next, as shown in FIG. 3, a resist 9 is applied onto the promotion film 8, and an opening 10 is formed in the resist 9 on the window region using a photoengraving process.

Figure 4:
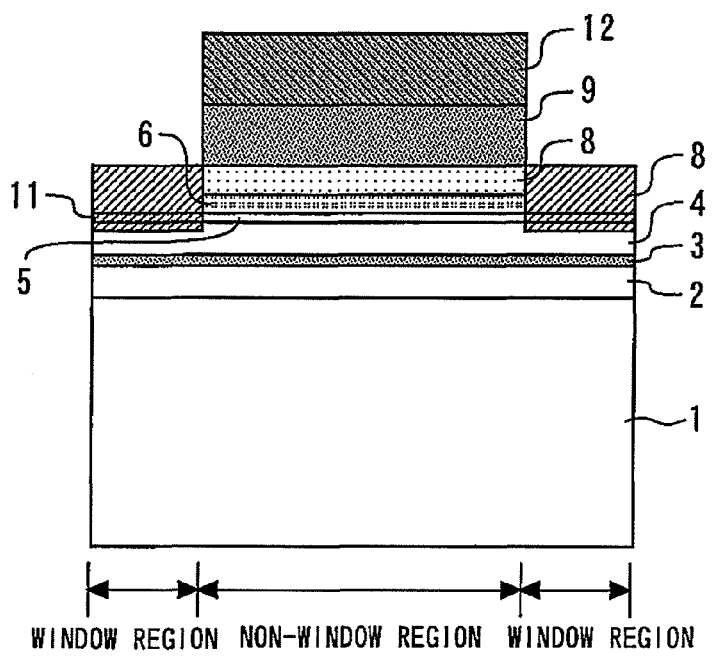

Next, as shown in FIG. 4, using the resist 9 as a mask, protons are implanted from above the resist 9 and the opening 10 by an ion implanting system under the condition of the accelerating voltage of 20 keV, and the dose of 6.7E+16 cm$^{-2}$. As a result, protons are implanted into the p-type contact layer 5 in the window region, and an intra-crystalline damaged region 11 is formed in the vicinity of the interface between the p-type contact layer 5 and the promotion film 8. In addition, an intra-resist damaged region 12 is also formed in the resist 9.

Here, the ion-implanting condition is that protons pass through the boundary between the p-type contact layer 5 and the promotion film 8, are implanted into the p-type contact layer 5, and do not damage the active layer 3. Thereby, characteristic deterioration of semiconductor lasers caused by the damage due to ion implanting can be inhibited. For example, when the materials and the film thicknesses of the p-type clad layer 4, the p-type contact layer 5, and the promotion film 8 are the above-described conditions; and the injected ions are protons; if the accelerating voltage at the time of ion implanting is 20 keV, the conditions are satisfied.

Figure 5:
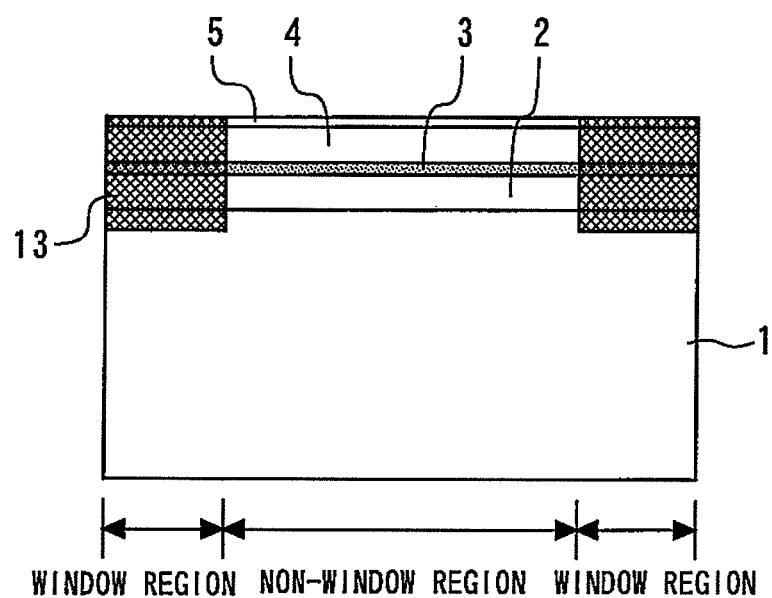

Next, as shown in FIG. 5, after removing the resist 9, the RTA (Rapid Thermal Annealing) method is used in the $N_2$ atmosphere to elevate the temperature to 900° C. at the temperature elevating rate of 50° C./s to perform a heat treatment for 18 seconds. By this heat treatment, Ga holes are diffused and the active layer 3 is disordered in the window region to form the window structure 13. Thereafter, the inhibition film 6 and the promotion film 8 are removed using a fluoric acid based etching solution.

Figure 6:
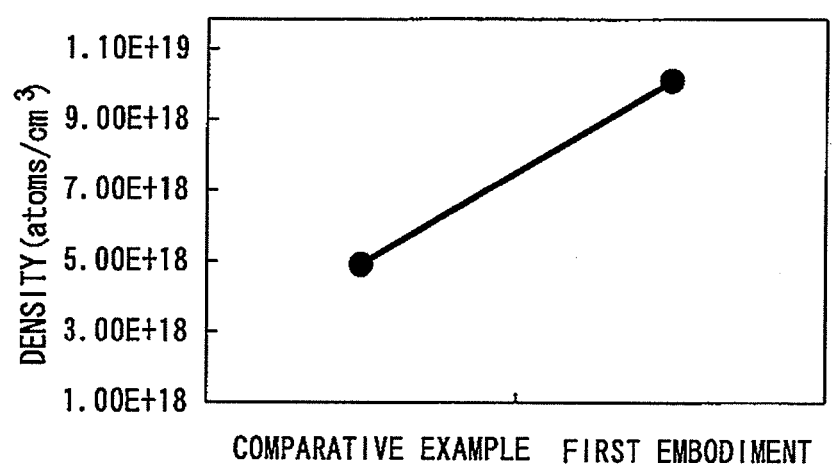
FIG. 6 is a graph showing the amount of Ga existing on the surface of the $SiO_2$ film.

Next, the effect of the first embodiment will be described by comparing with a comparative example. In the comparative example, no proton implantation is performed. FIG. 6 is a graph showing the amount of Ga existing on the surface of the $SiO_2$ film. This analysis was performed using a SIMS (Secondary Ion-microprobe Mass Spectrometer). It is seen from the results of the analysis that the quantity of Ga existing on the surface of $SiO_2$ is increased. This means that Ga holes formed on the p-type contact layer 5 has increased.

Figure 7:
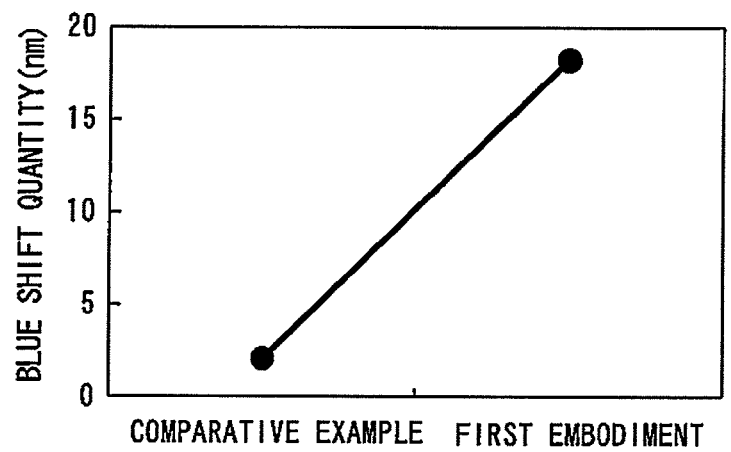
FIG. 7 is a graph showing the quantity of blue shift (shift to the short wavelength side) on the active layer.

FIG. 7 is a graph showing the quantity of blue shift (shift to the short wavelength side) on the active layer. This measurement was performed using PL (Photoluminescence). It is seen from the results of the measurement that the blue shift quantities increase by 16.2 nm by performing proton implantation. Here, between the light wavelength $\lambda$ and the band gap energy Eg, there is a relationship of $Eg=h \cdot c/\lambda$ (where h is a Planck's constant, and c is a light speed). Therefore, the increase of blue shift means the increase in the band gaps in the active layer.

As these experimental results show, by performing proton implantation, the quantities of Ga holes can be increased and the amount of change in band gaps can be elevated without elevating the heat treatment temperatures. As a result, the output of the semiconductor laser can be elevated. Also, since the elevation of the heat treatment temperature is not required, the rough crystal surface and the crack in the dielectric bodies do not occur, and the window structure can be stably formed.

In addition, as a result of performing the SIMS analysis, it was confirmed that implanted protons were dropped from the crystals by heat treatment. Therefore, although the ionic species can be ion-implantable atoms or molecules, such as He, Ne, Ar, or Si, protons wherein no implanted ions remain are preferable.

Second Embodiment

Figure 8:
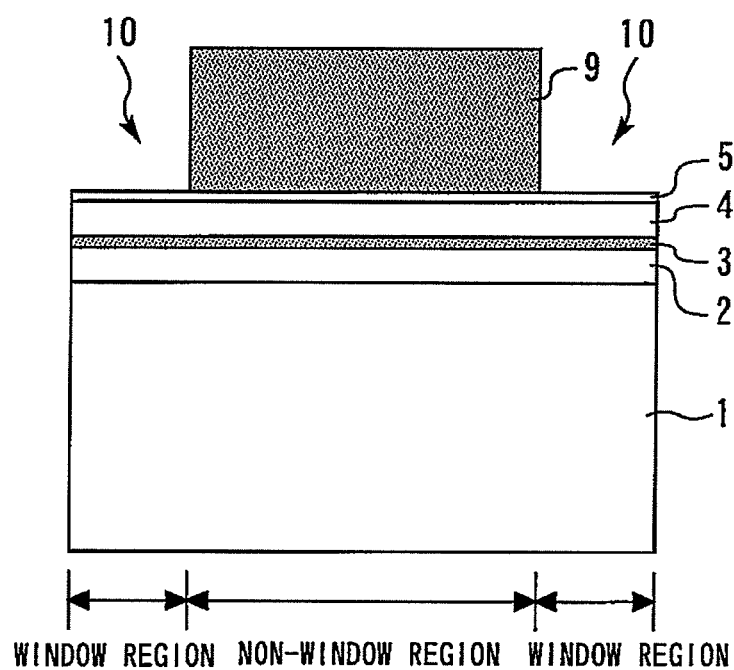
FIGS. 8 to 10 are sectional views showing the method for fabricating a semiconductor laser according to the second embodiment of the present invention.
Figure 9:
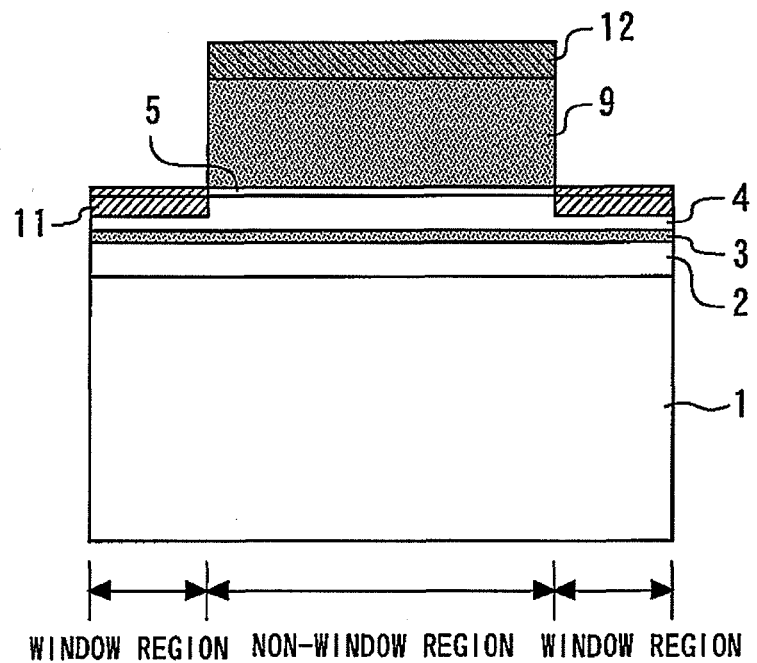
Figure 10:
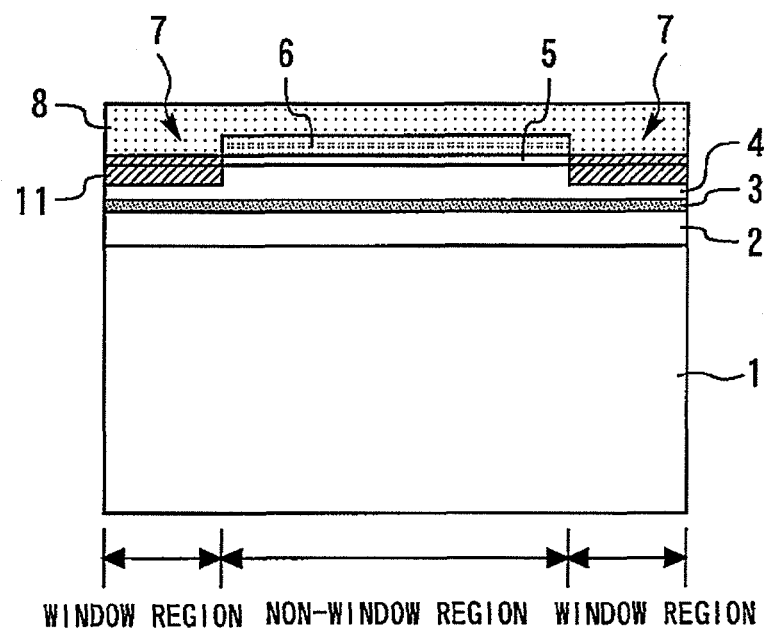

FIGS. 8 to 10 are sectional views showing the method for fabricating a semiconductor laser according to the second embodiment of the present invention. These drawings are sectional views taken along the direction of the laser oscillator.

Firstly, in the same manner as shown in FIG. 1 for the first embodiment, an n-type clad layer 2, an active layer 3 of a quantum well structure, a p-type clad layer 4, and a p-type contact layer 5 are sequentially formed on the n-type GaAs substrate 1 using MOCVD.

Next, as shown in FIG. 8, after applying a resist 9 onto the p-type contact layer 5, an opening 10 is formed in the window region using photoengraving on the resist 9.

Next, as shown in FIG. 9, protons are implanted from above the resist 9 and the opening 10 using an ion implanting apparatus and using the resist 9 as a mask. As a result, protons are implanted into the p-type contact layer 5 only in the window region, and an intra-crystalline damaged region 11 is formed only in the vicinity of the interface of the p-type contact layer 5 and the promotion film 8. Further, the intra-resist damaged region 12 is formed in the resist 9. Here, the ion implanting conditions are those that do not damage the active layer 3.

Next, as shown in FIG. 10, after removing the resist 9 an inhibition film 6 is formed on the p-type contact layer 5 using thermal CVD. Thereafter, an opening 7 is formed on the inhibition film 6 in the window region in the vicinity of the end plane. Then, a promotion film 8 is formed on the inhibition film 6 and the p-type contact layer 5 in the opening 7 using spattering. The promotion film 8 contacts the p-type contact layer 5 only in the window region.

In addition, in the same manner as FIG. 5 of the first embodiment, Ga holes are diffused by performing a heat treatment, and the active layer 3 is disordered in the window region to form the window structure 13. Thereafter, the inhibition film 6 and the promotion film 8 are removed using a fluoric acid based etching solution.

In the first embodiment, although ions are implanted after forming the promotion film 8, in the second embodiment, the promotion film 8 is formed after implanting ions. In this case also, the identical effects to that of the first embodiment can be obtained.

In addition, if the inhibition film 6 is a dielectric film to inhibit the formation of Ga holes, the material of the inhibition film 6 is not limited to SiN. If the promotion film 8 is a dielectric film to inhibit the formation of Ga holes, the material of the promotion film 8 is not limited to $SiO_2$, but for example, $SiO_x$, $SiN_x$, or $SiON_x$ films can also be used.

Also, the method for fabricating the inhibition film 6 is not limited to the thermal CVD, but also P-CVD (Plasma-Chemical Vapor Deposition) or spattering can be used. In addition, the method for forming the promotion film 8 is not limited to spattering, but vapor deposition or P-CVD can also be used.

Furthermore, the materials of the semiconductor laser are not limited to GaAs/AlGaAs group materials, but InGaAs/AlGaAs group materials or InGaAs/InGaAsP group materials of which the IFVD if confirmed, can also be used.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-032635, filed on Feb. 17, 2012, including specification, claims, drawings, and summary, on which the Convention priority of the present application is based, is incorporated herein by reference in its entirety.

What is claimed is:

1. A method for fabricating a semiconductor laser comprising:
   sequentially forming a cladding layer of a first conductivity type, an active layer, a cladding layer of a second conductivity type, and a contact layer of the second conductivity type on a semiconductor substrate;
   forming a promotion film which contacts the contact layer only in a window region proximate an end plane of the semiconductor laser and absorbs group-III atoms from the contact layer to promote generation of group-III vacancies;
   implanting ions into the contact layer in the window region to damage the contact layer in the window region; and
   after forming the promotion film and implanting the ions, heat treating so that the group-III vacancies are diffused and the active layer is disordered in the window region and forms a window structure.

2. The method for fabricating a semiconductor laser according to claim 1, comprising:
   forming an inhibition film inhibiting formation of the group-III vacancies on the contact layer;
   forming an opening in the inhibition film at the window region; and
   forming the promotion film on the inhibition film and on the contact layer in the opening.

3. The method for fabricating a semiconductor laser according to claim 1, comprising:
   forming a resist on the contact layer;
   forming an opening in the resist on the window region; and
   using the resist with the opening as a mask, implanting ions into the contact layer in the window region.

4. The method for fabricating a semiconductor laser according to claim 1, including implanting the ions without damaging the active layer.

5. The method for fabricating a semiconductor laser according to claim 1, including implanting the ions after forming the promotion film.

6. The method for fabricating a semiconductor laser according to claim 1, including forming the promotion film after implanting the ions.

* * * * *

UNITED STATES PATENT AND TRADEMARK OFFICE
CERTIFICATE OF CORRECTION

| | |
|---|---|
| PATENT NO. | : 8,551,797 B2 |
| APPLICATION NO. | : 13/597305 |
| DATED | : October 8, 2013 |
| INVENTOR(S) | : Shinji Abe |

Page 1 of 1

It is certified that error appears in the above-identified patent and that said Letters Patent is hereby corrected as shown below:

On the Title Page insert

--(30) Foreign Application Priority Data

February 17, 2012 (JP).........2012-032635--

Signed and Sealed this
Third Day of December, 2013

Margaret A. Focarino
*Commissioner for Patents of the United States Patent and Trademark Office*